(12) United States Patent
Chen et al.

(10) Patent No.: US 8,609,327 B2
(45) Date of Patent: Dec. 17, 2013

(54) FORMING SUB-LITHOGRAPHIC PATTERNS USING DOUBLE EXPOSURE

(75) Inventors: Kuang-Jung Chen, Poughkeepsie, NY (US); Wu-Song Huang, Brewster, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 962 days.

(21) Appl. No.: 12/170,722

(22) Filed: Jul. 10, 2008

(65) Prior Publication Data

US 2010/0009298 A1   Jan. 14, 2010

(51) Int. Cl.
*G03F 7/00* (2006.01)
*G03F 7/20* (2006.01)
*G03F 7/26* (2006.01)
*G03F 7/40* (2006.01)

(52) U.S. Cl.
USPC ........ 430/394; 430/396; 430/270.1; 430/330; 430/331

(58) Field of Classification Search
USPC .............. 430/270.1, 311, 312, 331, 330, 394, 430/396, 273.1
See application file for complete search history.

(56) References Cited

U.S. PATENT DOCUMENTS

| | | | |
|---|---|---|---|
| 5,811,222 A * | 9/1998 | Gardner et al. ............... | 430/312 |
| 5,905,019 A * | 5/1999 | Obszarny ..................... | 430/327 |
| 6,337,175 B1 * | 1/2002 | Yamaguchi ................... | 430/322 |
| 6,528,238 B1 * | 3/2003 | Seniuk et al. ................. | 430/312 |
| 6,942,958 B2 * | 9/2005 | Chen et al. .................... | 430/311 |
| 7,129,025 B2 * | 10/2006 | Tseng et al. .................. | 430/312 |
| 7,229,723 B2 * | 6/2007 | Rau ................................ | 430/5 |
| 7,252,909 B2 * | 8/2007 | Shin et al. .......................| 430/5 |
| 7,368,225 B1 * | 5/2008 | Subramanian et al. ....... | 430/311 |
| 7,781,149 B2 * | 8/2010 | Paxton et al. ................. | 430/311 |
| 7,794,898 B2 * | 9/2010 | Ryu ............................... | 430/5 |
| 7,794,921 B2 * | 9/2010 | Chen et al. .................... | 430/312 |
| 2004/0170929 A1 * | 9/2004 | Yang et al. .................... | 430/322 |
| 2005/0181313 A1 * | 8/2005 | Shih et al. ..................... | 430/394 |
| 2005/0196708 A1 * | 9/2005 | Hsu et al. ...................... | 430/321 |
| 2006/0194156 A1 * | 8/2006 | Watanabe et al. ............. | 430/394 |
| 2009/0042389 A1 * | 2/2009 | Ho ................................. | 438/689 |

* cited by examiner

*Primary Examiner* — Amanda C. Walke
(74) *Attorney, Agent, or Firm* — Wenjie Li; Hoffman Warnick LLC

(57) ABSTRACT

Methods are presented of forming sub-lithographic patterns using double exposure. One method may include providing a photoresist layer over a layer to be patterned; exposing the photoresist layer using a first mask having a first opening; developing the photoresist layer to transfer the first opening into the photoresist layer, forming a boundary in the photoresist layer about the transferred first opening that is hardened; exposing the photoresist layer using a second mask having a second opening that overlaps the boundary; and developing the photoresist layer to transfer the second opening into the photoresist layer, leaving the boundary, wherein the boundary has a sub-lithographic dimension.

18 Claims, 9 Drawing Sheets

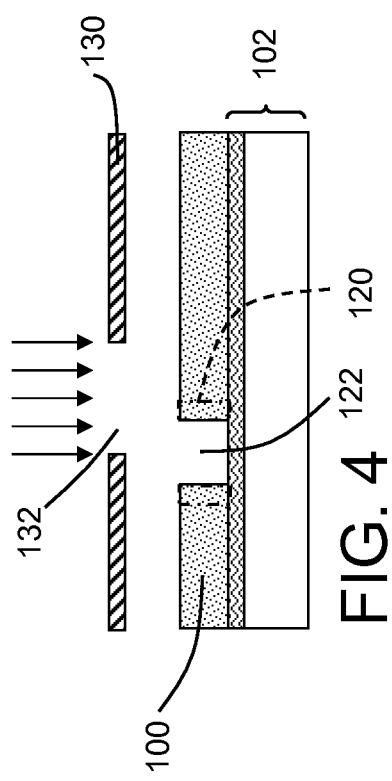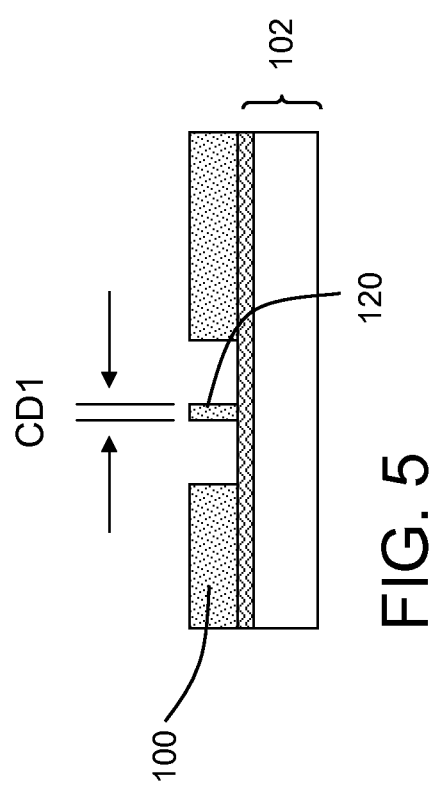

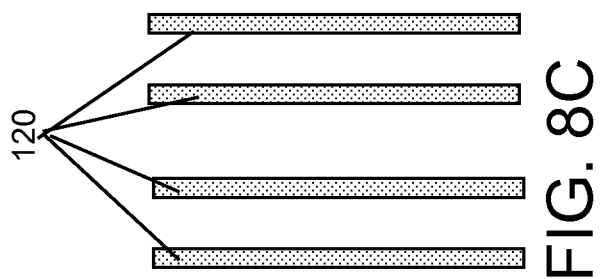
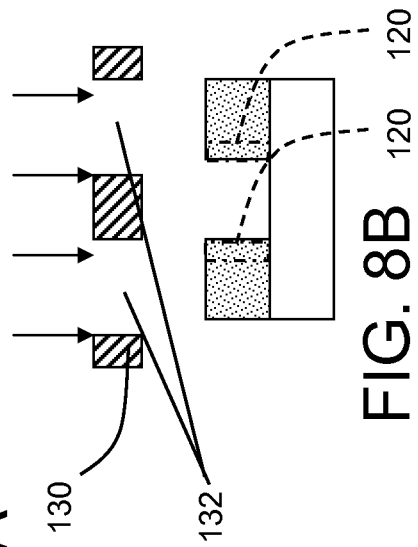
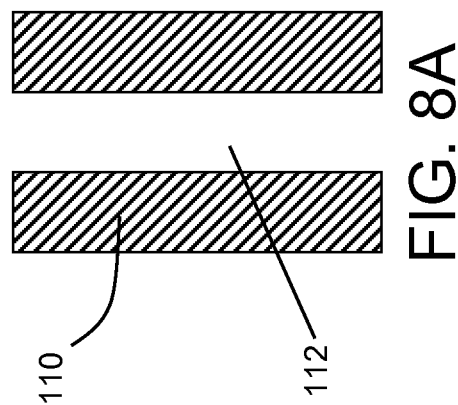

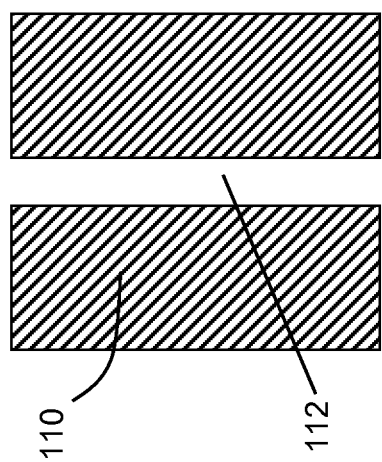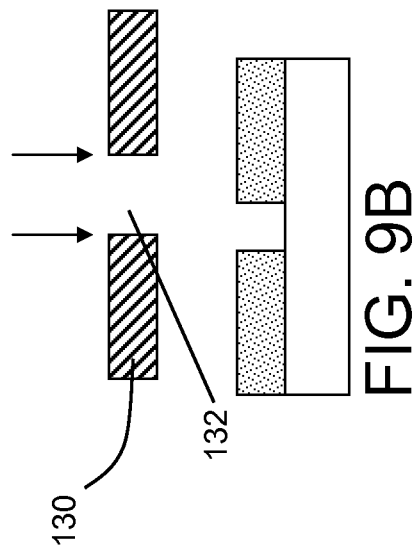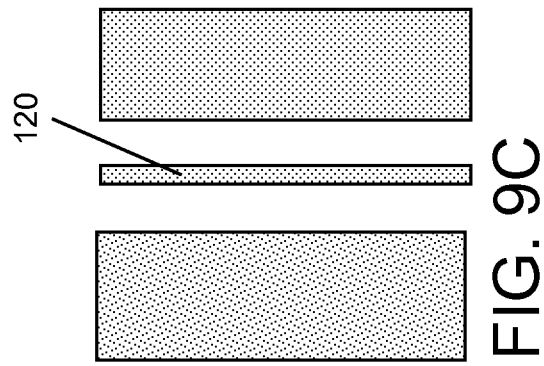

FORMING SUB-LITHOGRAPHIC PATTERNS USING DOUBLE EXPOSURE

BACKGROUND

1. Technical Field

The disclosure relates generally to integrated circuit (IC) chip fabrication, and more particularly, to methods of forming sub-lithographic patterns.

2. Background Art

Double exposure methods are used during integrated circuit (IC) chip fabrication. The existing double exposure method requires two steps of resist coating process and two exposures. The double patterning method can achieve smaller pitch size, however, both overlay and critical dimension (CD) control are difficult.

SUMMARY

Methods are presented of forming sub-lithographic patterns using double exposure. One method may include providing a photoresist layer over a layer to be patterned; exposing the photoresist layer using a first mask having a first opening; developing the photoresist layer to transfer the first opening into the photoresist layer, forming a boundary in the photoresist layer about the transferred first opening that is hardened; exposing the photoresist layer using a second mask having a second opening that overlaps the boundary; and developing the photoresist layer to transfer the second opening into the photoresist layer, leaving the boundary, wherein the boundary has a sub-lithographic dimension.

A first aspect of the disclosure provides a method comprising: providing a photoresist layer over a layer to be patterned; exposing the photoresist layer using a first mask having a first opening; developing the photoresist layer to transfer the first opening into the photoresist layer, forming a boundary in the photoresist layer about the transferred first opening that is hardened; exposing the photoresist layer using a second mask having a second opening that overlaps the boundary; and developing the photoresist layer to transfer the second opening into the photoresist layer, leaving the boundary, wherein the boundary has a sub-lithographic dimension.

A second aspect of the disclosure provides a method comprising: providing a photoresist layer over a layer to be patterned; exposing the photoresist layer using a first mask having a first opening and using a first dose; developing the photoresist layer to transfer the first opening into the photoresist layer, forming a boundary that is hardened in the photoresist layer about the transferred first opening; exposing the photoresist layer using a second mask having a second opening that overlaps the boundary and using a second dose that is different than the first dose, wherein the first opening has a different shape than the second opening; and developing the photoresist layer to transfer the second opening into the photoresist layer, leaving the boundary, wherein the boundary has a sub-lithographic dimension.

A third aspect of the disclosure provides a method comprising: first exposing and developing an opening in a photoresist layer, forming a hardened boundary in the opening; and second exposing and developing another opening in the photoresist layer that overlaps the hardened boundary, and results in a patterned photoresist layer having the boundary with a sub-lithographic dimension.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1-5 show embodiments of a method according to the disclosure.

FIGS. 7A-12D show various applications for the methods of FIGS. 1-5.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

FIGS. 1-5 show embodiments of a method according to the disclosure. In one embodiment, the method includes exposing and developing an opening in a photoresist layer, forming a hardened boundary in the opening, and then exposing and developing another opening in the photoresist layer that overlaps the hardened boundary. The meaning of hardened boundary is that the boundary becomes harder for the developer to dissolve in the developing process. The latter exposure and developing results in a patterned photoresist layer having the boundary with a sub-lithographic dimension. The boundary may then be used to pattern an underlying layer having the sub-lithographic dimension.

Figure 1:
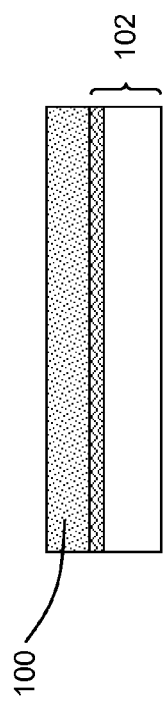

FIG. 1 shows a first process of providing a photoresist layer 100 over a layer(s) 102 to be patterned. Layer(s) 102 may be any type of material typically used in IC chip fabrication. Photoresist layer 100 may include a chemically amplified resist such as any typical 193 nm chemically amplified positive tone resists.

Figure 2:
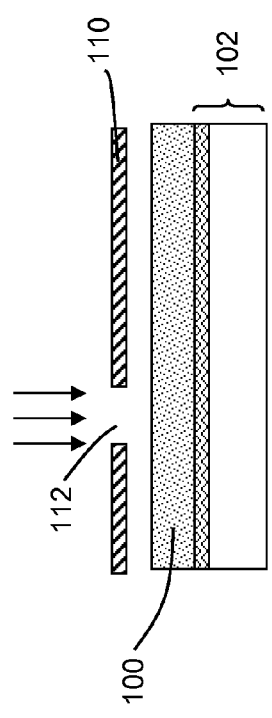
Figure 3:
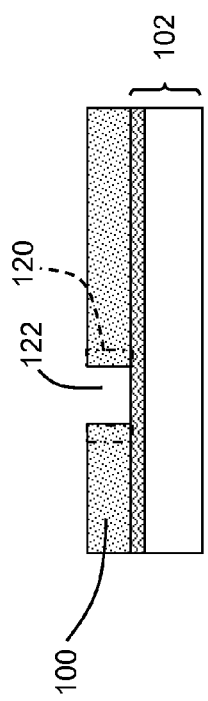

FIG. 2 shows exposing photoresist layer 100 using a first mask 110 having a first opening 112. As will be described in greater detail herein, first opening 112 may have a variety of shapes. As shown in FIG. 3, photoresist layer 110 (FIG. 2) is developed to transfer first opening 112 into photoresist layer 100. The developing forms a boundary 120 in photoresist layer 100 about transferred first opening 122. Boundary 120 is hardened due to its chemical composition and has been significantly altered during the first developing process, and the altered composition makes it harder for the developer to dissolve.

FIG. 4 shows exposing photoresist layer 100 using a second mask 130 having a second opening 132 that overlaps boundary 120. The overlap has a dimension that is sub-lithographic, i.e., it cannot be generated using conventional lithographic techniques and systems. Current technology has a limitation of approximately 52 nm using a 193 nm stepper with numerical aperture (NA) of 0.93.

FIG. 5 shows developing photoresist layer 100 to transfer second opening 132 into photoresist layer 100. The result of the second exposure/developing is that boundary 120 remains, and has a sub-lithographic dimension (CD) of about 40 nm.

Figure 6A:
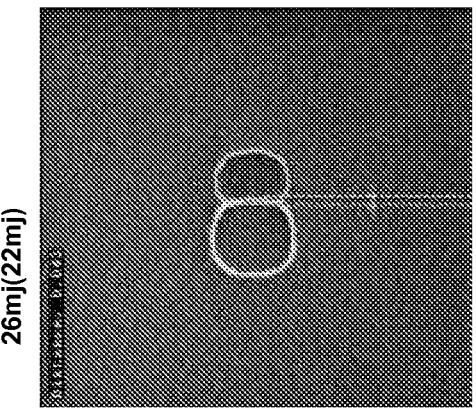
FIGS. 6A-C show images of various exposure doses used according to the methods of FIGS. 1-5.
Figure 6B:
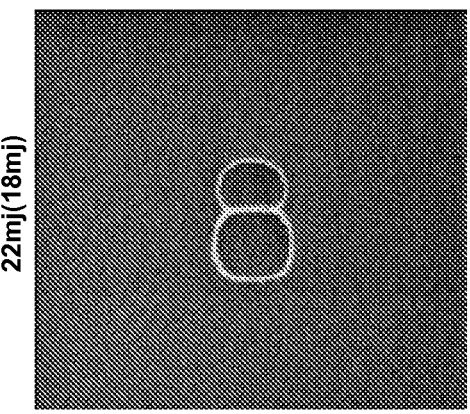
Figure 6C:
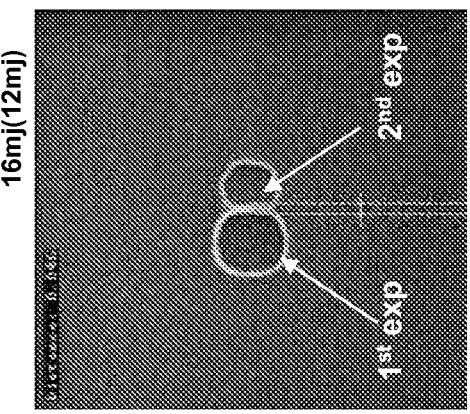

In one embodiment, the first exposure of FIG. 2 has a first dose and the second exposure of FIG. 4 uses a second dose. The first dose and the second dose can be the same or different. For a different dose, the first dose may be larger than the second dose or vice versa. FIGS. 6A-6B show images of various examples of different doses for a line formed by two exposures (first on left, second on right) by circular openings. FIG. 6A shows a first dose of approximately 16 milli-Joules (mJ) and second dose 12 mJ; FIG. 6B shows a first dose of approximately 22 mJ and a second dose of approximately 18 mJ; and FIG. 6C shows a first dose of approximately 26 mJ and a second dose of approximately 22 mJ. Other dose values may also be employed.

Figure 7B:
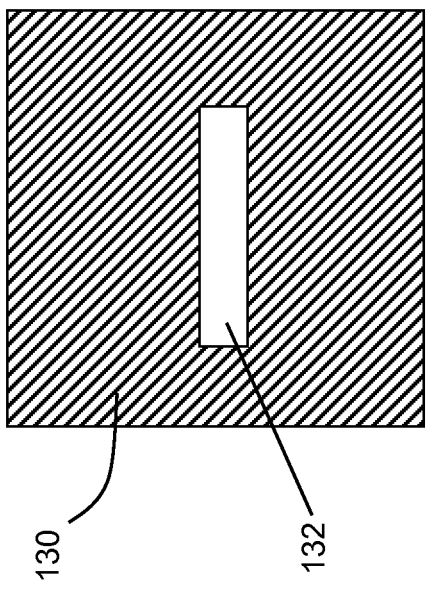
Figure 7C:
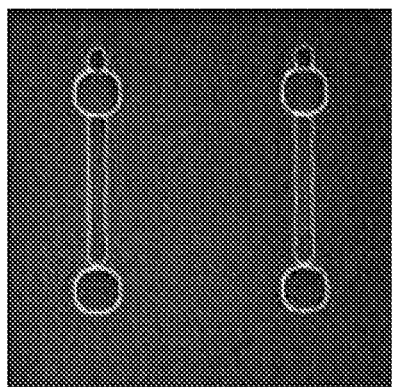
Figure 7A:
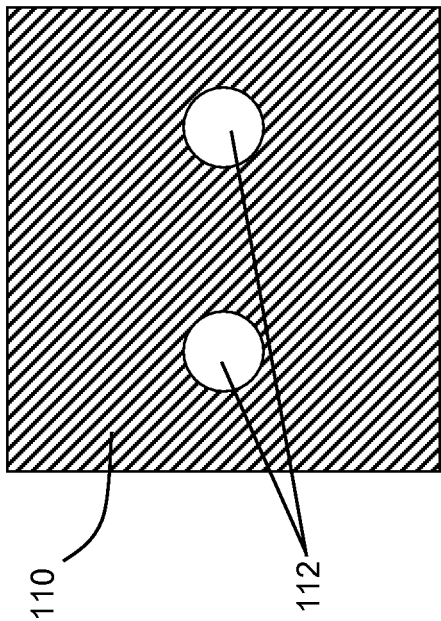

FIGS. 7A-12C show illustrative applications of the above-described methodology. As will become apparent, masks 110, 130 having different shaped first opening(s) 112 (FIG. 2) and second opening(s) 132 (FIG. 4) may be employed to create a variety of photoresist patterns. FIGS. 7A-C show one embodiment in which a first mask 110 has two circular openings 112 (FIG. 7A in plan view) and a second mask 130 (FIG. 7B in plan view) has rectangular opening 132 configured to overlap the transferred pattern of two circular openings to arrive at the sub-lithographic line boundaries (where circles and rectangle overlap) shown in the images of FIG. 7C (2 sets of images). In this case, boundary 120 would have a few curved shapes.

FIGS. 8A-C show another embodiment in which a first mask 110 has one linear opening 112 (FIG. 8A in plan view) and a second mask 130 (FIG. 8B in cross-section) has the same shaped openings 132 configured to overlap the transferred linear opening 112 to arrive at the four sub-lithographic lines boundaries 120 shown in FIG. 8C. In this case, boundary(ies) 120 would have a linear shape, and may be advantageous in forming, for example, fin-type field effect transistors (finFETs).

FIGS. 9A-C show one embodiment in which a first mask 110 has a rectangular opening 112 (FIG. 9A in plan view) and a second mask 130 (FIG. 9B in cross-section) has rectangular openings 132 configured to overlap transferred first opening 112 to arrive at sub-lithographic line boundary 120 shown in FIG. 9C. Mask 110 and 130 may be the same mask in this embodiment. In this case, boundary 120 would have a linear shape, which may be advantageous in forming, for example, an e-fuse.

Figure 10C:
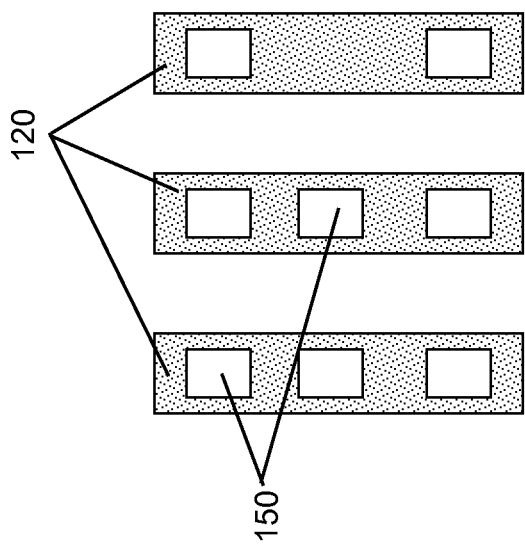
Figure 10B:
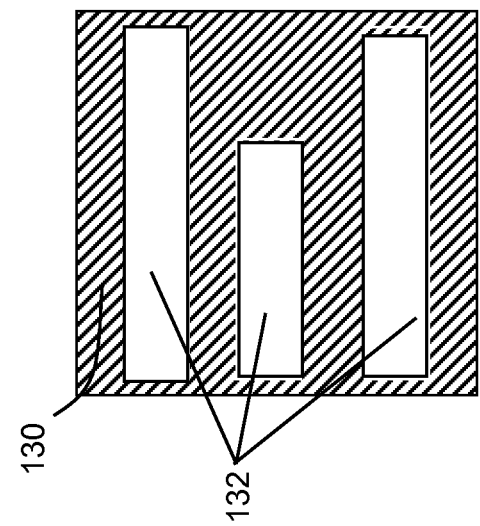
Figure 10A:
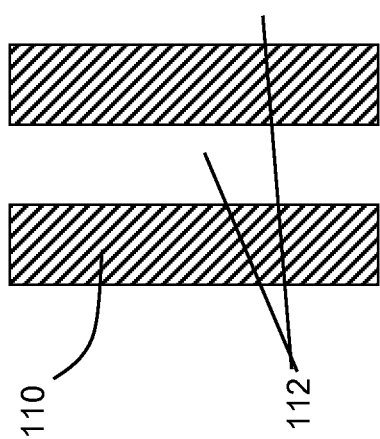

FIGS. 10A-C show another embodiment in which a first mask 110 has three rectangular shaped masked areas with openings 112 (FIG. 10A in plan view) and a second mask 130 (FIG. 10B in plan view) has rectangular openings 132 configured to overlap transferred first opening 112 in a perpendicular manner to arrive at sub-lithographic line boundaries 120 shown in FIG. 10C. In this case, boundary 120 would have a rectangular shape but with openings 150 therein, which may be advantageous in forming, for example, contacts.

Figure 11C:
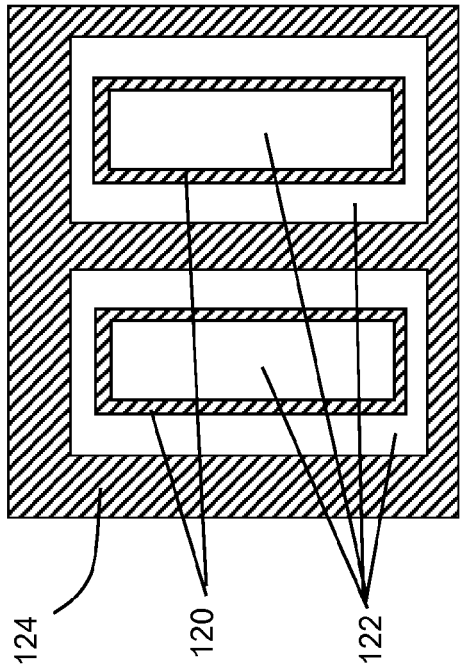
Figure 11B:
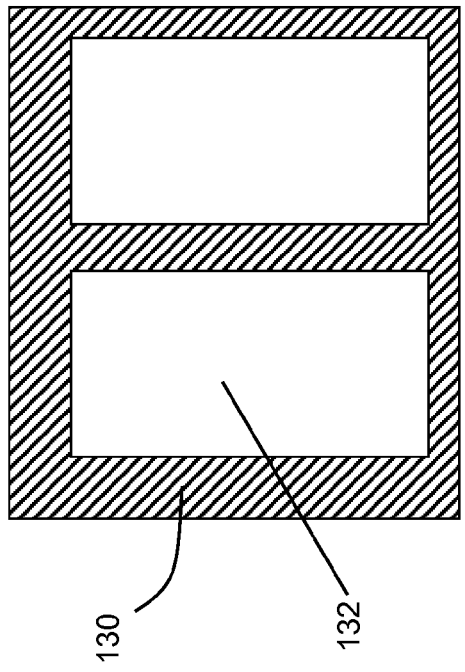
Figure 11A:
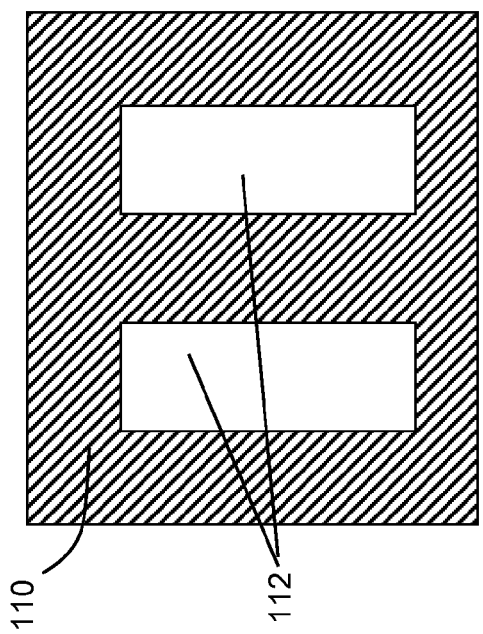

FIGS. 11A-C show one embodiment in which a first mask 110 has a rectangular openings 112 (FIG. 11A in plan view) and a second mask 130 (FIG. 11B in plan view) has rectangular openings 132 configured to overlap transferred first opening 112 in a manner to arrive at sub-lithographic boundaries 120 in the form of rectangular rings in rectangular openings of 122 within the large resist area 124, shown in FIG. 11C. In this case, boundary 120 would have a rectangular ring shape, which may be advantageous in improving deep trench capacitors by increasing surface area thereof.

Figure 12B:
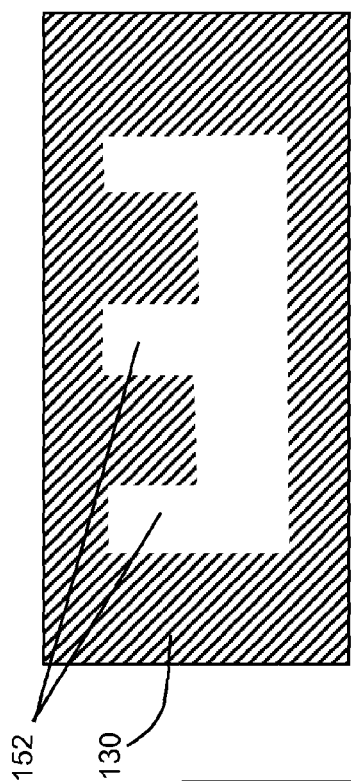
Figure 12D:
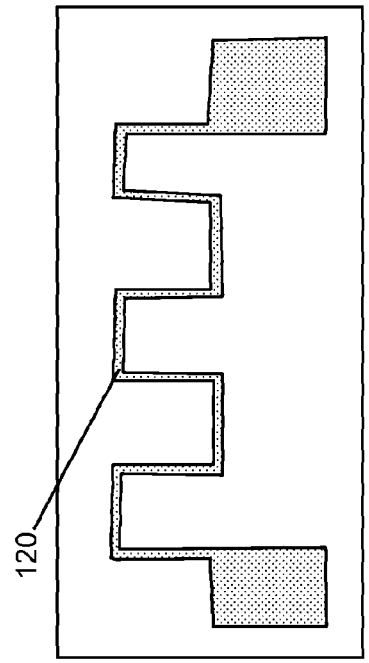
Figure 12A:
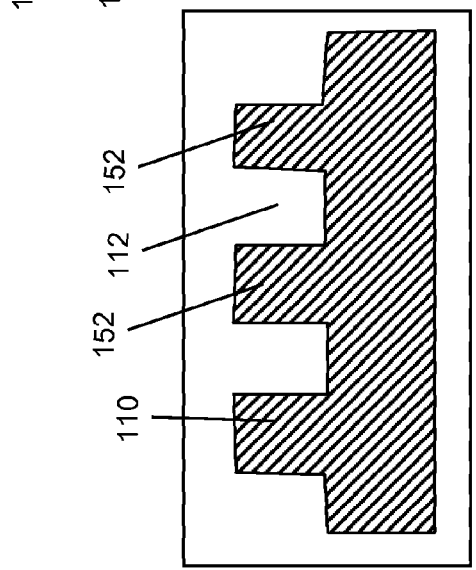
Figure 12C:
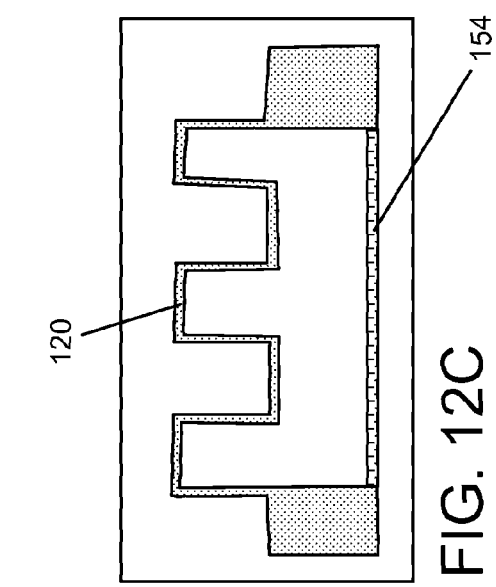

FIGS. 12A-D show another embodiment in which a first mask 110 has first openings 112 that form teeth like structures 152 (FIG. 12A in plan view) and a second mask 130 with teeth like openings 152 (FIG. 12B in plan view). The second exposure is configured to overlap the first exposure so as to arrive at sub-lithographic boundary 120, as shown in FIG. 12C, in the form of a rectangular sinusoidal shape. In this case, as shown in FIG. 12C, a trim process may be performed on photoresist layer 100 (FIG. 5) to remove a portion 154 of boundary 120 to obtain the final shape shown in FIG. 12D. The sub-lithographic sinusoidally shaped boundary 120 may be advantageous in forming, for example, resistor elements.

Although particular boundary patterns have been described herein for photoresist layer 100 (FIG. 5), it is understood that a wide variety of shapes not described herein can be formed using the teachings of the disclosure. In particular, use of a trim process may allow a large variety of patterns to be formed having sublithographic dimensions.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   providing a photoresist layer over layer to be patterned, wherein the photoresist layer is a chemically amplified resist;
   exposing the photoresist layer using a first mask having a first opening;
   developing the photoresist layer to transfer the first opening into the photoresist layer,
      wherein the developing results in forming a hardened boundary in the photoresist layer about the transferred first opening,
      wherein forming the hardened boundary includes altering a chemical composition of the photoresist layer about the transferred first opening, and
      wherein the altered chemical composition increases resistance to dissolution of a developer;
   exposing the photoresist layer using a second mask having a second opening that overlaps the hardened boundary; and
   developing the photoresist layer to transfer the second opening into the photoresist layer, leaving the hardened boundary
      wherein the hardened boundary has a sub-lithographic.

2. The method of claim 1, wherein the first exposing has a first dose and the second exposing uses a second dose, wherein the first dose is different from the second dose.

3. The method of claim 1, wherein the chemically amplified resist is a 193 nm positive tone chemically amplified resist.

4. The method of claim 1, wherein the first opening has a different shape than the second opening.

5. The method of claim 1, wherein the hardened boundary has a linear shape.

6. The method of claim 1, wherein the hardened boundary has a ring shape.

7. The method of claim 1, wherein the first mask and the second mask are the same mask.

8. The method of claim 1, further comprising performing a trim process on the photoresist layer to remove a portion of the hardened boundary.

9. The method of claim 8, wherein the hardened boundary has a sinusoidal shape.

10. A method comprising:
    providing a photoresist layer over layer to be patterned, wherein the photoresist layer is a chemically amplified resist;
    exposing the photoresist layer using a first mask having a first opening and using a first dose;
    developing the photoresist layer to transfer the first opening into the photoresist layer,
       wherein the developing results in forming a hardened boundary in the photoresist layer bout the transferred first opening,
       wherein forming the hardened boundary includes altering a chemical composition of the photoresist layer about the transferred first opening, and
       wherein the altered chemical composition increases resistance to dissolution of a developer;
    exposing the photoresist layer using a second mask having a second opening that overlaps the hardened boundary and using a second dose that is different than the first dose, wherein the first opening has a different shape than the second opening; and
    developing the photoresist layer to transfer the second opening into the photoresist layer, leaving the hardened boundary
    wherein the hardened boundary has a sub-lithographic dimension.

11. The method of claim 10, wherein he first dose is larger than the second dose.

12. The method of claim 10, wherein the hardened boundary has a linear shape.

13. The method of claim 10, wherein the hardened boundary has a ring shape.

14. The method of claim 10, wherein the first mask and the second mask are the same mask.

15. The method of claim 10, further comprising performing a trim process on the photoresist layer to remove a portion of the hardened boundary.

16. The method of claim 15, wherein the hardened boundary has a rectangular sinusoidal shape.

17. A method comprising:
    first exposing and developing a first opening in a photoresist layer,
       wherein the developing results in forming a hardened boundary in the opening,
       wherein forming the hardened boundary includes altering a chemical composition of the photoresist layer about the first opening, and
       wherein the altered chemical composition increases resistance to dissolution of a developer; and
    second exposing and developing another opening in the photoresist layer that overlaps the hardened boundary, and results in a patterned photoresist layer having the hardened boundary with a sub-lithographic dimension.

18. The method of claim 17, wherein the first and second exposing use different energy doses.

* * * * *